(12) United States Patent
Ishida et al.

(10) Patent No.: US 6,590,611 B1
(45) Date of Patent: Jul. 8, 2003

(54) SOLID-STATE IMAGE-PICKUP DEVICES AND METHODS FOR MOTION DETECTION

(75) Inventors: Tomohisa Ishida, Tokyo (JP); Hitoshi Nomura, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/199,996

(22) Filed: Nov. 24, 1998

(30) Foreign Application Priority Data

Nov. 28, 1997 (JP) ............................................. 9-327681

(51) Int. Cl.[7] .......................... H04N 9/64; H04N 5/228; H04N 3/14; H04N 5/335; H01L 27/00
(52) U.S. Cl. .................. 348/310; 348/243; 348/208.12; 250/208.1
(58) Field of Search ................................ 348/302–304, 348/308, 294, 297, 298, 300, 241, 243, 310; 250/208.1

(56) References Cited

U.S. PATENT DOCUMENTS

| | | | |
|---|---|---|---|
| 4,609,825 A | * 9/1986 | Berger et al. | ................ 348/324 |
| 4,959,723 A | * 9/1990 | Hashimoto | ................... 348/302 |
| 5,563,429 A | 10/1996 | Isogai | |
| 5,631,704 A | 5/1997 | Dickinson et al. | |
| 5,933,189 A | * 8/1999 | Nomura | ....................... 348/302 |
| 5,965,871 A | * 10/1999 | Zhou et al. | ............... 250/208.1 |
| 6,091,793 A | 7/2000 | Kamashita | |
| 6,130,713 A | * 10/2000 | Merrill | ........................ 348/308 |
| 6,166,769 A | * 12/2000 | Yonemoto et al. | ........... 348/308 |

OTHER PUBLICATIONS

Ishida et al., "The Development of a 1.6 M Pixel Amplification Type Image Sensor BCAST," *Eizojoho Mediagakkai Shi* 51:211–218 (1997).

Panicacci et al., "TP 6.5: 128 Mb/s Multiport CMOS Binary Active–Pixel Image Sensor," *ISSCC96, Digest of Technical Papers*, pp. 100–101, Feb. 8, 1996.

* cited by examiner

*Primary Examiner*—Ngoc-Yen Vu
*Assistant Examiner*—Nhan T. Tran
(74) *Attorney, Agent, or Firm*—Klarquist Sparkman LLP

(57) ABSTRACT

Solid-state image-pickup devices and associated drive methods are disclosed that simultaneously provide an image signal and a motion-detection signal. A representative device comprises an array of multiple pixels that produce pixel outputs according to amounts of light received by individual pixels. A vertical-readout line is provided for each column of pixels. A vertical-scanning circuit sequentially outputs signals from the pixels to the vertical-readout lines in horizontal-line units. Differential-processing circuits subtract out dark signals from image signals. Body-motion-detection circuits output a signal based on the difference between the pixel outputs during a current frame and the pixel outputs during a previous frame. A horizontal-scanning circuit sequentially delivers the outputs of the differential-processing circuits and the body-motion-detection circuits onto respective horizontal-readout lines to simultaneously form an image signal and motion-detection signal. The device can provide an electronic shutter function. The motion-detection signal can be either analog or single-bit digital.

22 Claims, 8 Drawing Sheets

SOLID-STATE IMAGE-PICKUP DEVICES AND METHODS FOR MOTION DETECTION

FIELD OF THE INVENTION

This invention pertains to solid-state image-pickup devices (SSIPDs) with motion-detection capabilities and to associated drive methods. In particular, this invention pertains to SSIPDs that simultaneously output an image signal and a motion-detection signal.

BACKGROUND OF THE INVENTION

Solid-state image-pickup devices (SSIPDs) are typically used in electronic camera equipment such as camcorders, digital still cameras, and monitoring devices. SSIPDs measure light intensity at discreet locations to image a scene, and contain an array of pixels that convert light intensity into measurable voltage signals. These voltage signals are then processed to produce an output signal that may be stored or viewed on a video display.

It is sometimes desired to add a motion-detection capability to an SSIPD. Conventional motion-detection devices of this type typically detect motion by comparing the difference between frames of image data output by the SSIPD. A "frame" of image data comprises the output signals of all of the pixels in the array during the most recent output cycle. Conventional devices of this type typically provide frame-update rates of five or more frames per second.

FIG. 9 shows the major functional blocks of a motion-detection image-processing sequence commonly employed in a conventional motion-detection image-processing device 100. The motion-detection image-processing device 100 comprises an SSIPD 101, an analog-to-digital (A/D) converter 102 that converts the analog image signal output by the SSIPD 101 into a digital signal, a first-frame image memory 103, a second-frame image memory 104, and an image-processing circuit 105 that detects motion by comparing the digital image data stored in the first-frame and second-frame image memories 103 and 104.

The motion-detection image-processing device 100 processes image data in the following sequence. During a first step, the analog image signals output by the pixels of the device during a first frame of image output are converted into corresponding digital signals (i.e., "digitized")by the A/D converter 102. The digital signals are stored in the first-frame image memory 103. Next, the image signals obtained during a second frame, immediately subsequent to the first frame, are digitized by the A/D converter 102, and stored in the second-frame image memory 104.

In the image-processing circuit 105, the digital signal stored in the first-frame image memory 103 and the digital signal stored in the second-frame image memory 104 are compared on a pixel-by-pixel basis to detect motion. For example, all of the digitized pixel-output values stored in the first image memory 103 may be subtracted from respective digitized pixel-output values stored in the second-image memory 104; if the difference between any two corresponding pixel outputs exceeds a predetermined threshold, the pixel-output difference data may be stored in the image-processing circuit 105. By comparing the frame images in this manner, it is possible to detect motion of a subject within the image being exposed.

There are several problems with the foregoing conventional approach to detecting motion using a SSIPD. The additional circuitry required for the first-frame and second-frame image memories 103, 104, and the image-processing circuit 105 increase the size of the device, making it more costly to manufacture. Also, A/D conversion normally causes a loss in signal quality. Because the pixels are arranged in a tightly packed array, the A/D converters must be located externally to the pixel array. The analog signals output by the pixels are easily affected by peripheral noise caused by high-frequency switching of thousands of MOS switches that are in close proximity to electrical pathways connecting each pixel output to the A/D converters. Thus, by the time the pixel-output signals reach the A/D converters, the signals typically no longer accurately reflect the respective signal values at the pixel outputs.

Moreover, in a conventional motion-detection image-processing device 100, the dynamic range (bandwidth) of the image signal from a given pixel is limited by the respective A/D converter 102. Normally, the bandwidth of an A/D converter 102 is narrower than the bandwidth of the SSIPD 101. Consequently, the entire bandwidth of the SSIPD 101 cannot be effectively used for motion detection.

Conventional analog-to-digital processing is also subject to phase-shift errors that adversely affect the accuracy of motion detection. Each A/D converter 102 processes analog signals on a sequential basis in which the outputs from the pixels in a given horizontal row are processed before proceeding to the pixels in the next horizontal row. As a result, if the A/D conversion circuitry is not properly synchronized with the readout of the pixel outputs, the location of the data for a particular pixel (or sets of adjacent pixels) may be "shifted" in the first-frame or second-frame image memories. For example, suppose that the digitized pixel-output data for all of the pixels in the lower half of the pixel array produced during a first frame is shifted (out of phase) relative to the corresponding digitized pixel-output data produced during a subsequent second frame. In such a case, the difference of the output data produced between frames at a given pixel location in the lower half of the pixel array can no longer be accurately measured because the data corresponding to a particular pixel location in the first-frame image memory is shifted relative to the data of the particular pixel in the second-frame image memory. This phase shift reduces the accuracy of the motion-detection device.

A potential solution to the foregoing problems, which has been considered, is to store the image signals in digital form from the first and second frames in a memory, and route the first-frame and second-frame image signals for each pixel from the memory through a comparator to measure the difference between the frames on a pixel-by-pixel basis. Such a scheme could be implemented by placing local storage circuitry and a comparator in close proximity to each pixel, or by including storage and comparator circuitry with each pixel. The problem with these schemes is that the solid-state surface area required for each such pixel and its associated memory and comparator circuitry is increased, resulting in a corresponding decrease in resolution and/or aperture ratio of the SSIPD. Another problem is that only a motion-detection signal is produced without simultaneously outputting an image signal.

In addition, frame-by-frame comparison techniques as used in conventional motion-detection devices do not accurately detect the motion of a rapidly-moving body.

SUMMARY OF THE INVENTION

In view of the foregoing shortcomings of conventional devices, an object of the invention is to provide motion-detection solid-state image-pickup devices (SSIPDs) that provide an electronic shutter function without requiring external image-comparison processing for motion detection. Another object of the invention is to provide motion-detection SSIPDs capable of simultaneously outputting motion-detection signals and image signals. Yet another object is to provide motion-detection SSIPDs that can output a high-quality image signal from which "dark" signals have been removed. A further object is to provide motion-detection SSIPDs that can evaluate the motion of a body being imaged.

The invention is exemplified herein by several example embodiments that accomplish the foregoing objects by providing image-processing and motion-detection circuitry that simultaneously output an image signal and a motion-detection signal. The motion-detection circuitry compares the pixel outputs from a current frame and a previous frame, to determine if any motion has occurred between the frames, on a pixel-by-pixel basis. The image-processing circuitry subtracts "dark" signals from the pixel-output signals so as to output an image signal from which the dark signals have been removed.

According to one aspect of the invention, SSIPDs with motion-detection capability are provided that comprise multiple pixels arranged in an array of at least one column and at least one row (typically an array of multiple rows and columns). Each pixel produces an electrical output signal according to a corresponding light quantity received by the pixel.

According to a first representative embodiment, a respective individual vertical-readout line is provided for each column of pixels, wherein each pixel in the respective column has a output that is connected to the respective vertical-readout line. Each vertical-readout line has an output terminus. A first vertical-scanning circuit controllably switches the outputs of the pixels in each column to the respective vertical-readout line according to a predetermined readout sequence. The output termini of the vertical-readout lines are connected to respective differential-processing circuits (i.e., preferably one differential-processing circuit per vertical-readout line).

Each differential-processing circuit receives pixel-output signals and corresponding pixel dark signals carried by the respective vertical-readout line, and provides an output signal, from which the pixel dark signals have been removed, at an output terminus of the respective differential-processing circuit. A first horizontal-readout line is commonly connected to the output termini of the differential-processing circuits. The output terminus of each vertical-readout line is also connected to a respective body-motion-detection circuit (i.e., preferably one body-motion-detection circuit per respective vertical-readout line). The differential-processing circuits store pixel dark signals delivered thereto by the respective vertical-readout lines.

The body-motion-detection circuits receive pixel-output signals obtained during a previous frame from the respective vertical-readout lines and store the previous-frame pixel-output signals. Subsequently, pixel-output signals produced during the current frame are output to the respective vertical-readout lines. A horizontal-scanning circuit provides control signals to the differential-processing circuits so that the current-frame pixel-output signals are received by the differential-processing circuits, processed, and output to the first horizontal-readout line in a horizontal-line-readout sequence to form an image signal.

Similarly, the horizontal-scanning circuit provides control signals to the body-motion-detection circuits so that the current-frame pixel-output signals are received by the body-motion-detection circuits, processed, and output to a second horizontal-readout line in a horizontal-line-readout sequence to form a motion-detection signal. The output signals of the differential-processing circuits represent pixel-output signals with dark signals removed. The outputs of the body-motion-detection circuits represent a motion-detection signal comprising the difference between the current-frame pixel-output signal and the previous-frame pixel-output signal. The device is preferably driven such that the image signal and the motion-detection signal are synchronized.

Each pixel of the first representative embodiment preferably comprises a respective MOS switch (or analogous component) for discharging the respective photodiode of the pixel and thus performing an "electronic shutter" function. To such end, each such switch controllably discharges residual charges in the respective photodiode in preparation for outputting an image from a current frame.

According to a second representative embodiment, a solid-state image-pickup device is provided that comprises a set of differential-detection circuits in place of the body-motion-detection circuits of the first representative embodiment. The differential-detection circuits preferably comprise multiple sample-and-hold circuits and a comparator circuit. The sample-and-hold circuits preferably comprise first and second sample-and-hold circuits that hold pixel-output signals from the current frame and from the previous frame. The comparator circuit preferably comprises a pair of comparators that receive the pixel-output signals from the sample-and-hold circuits and output a binary (digital) signal based on whether the absolute value of the difference between the pixel-output signals for the current frame and the pixel-output signals for the previous frame exceed a predetermined threshold value.

In an alternative configuration the comparator circuit comprises multiple inverters and a feedback loop. The outputs of the differential-detection circuits are read in by a horizontal-scanning circuit, preferably comprising a shift register. The horizontal-scanning circuit outputs the binary signals in a horizontal-line-readout sequence to form a single-bit digitized motion-detection signal. The device simultaneously outputs synchronized motion-detection signal and image signals.

Each of the pixels preferably comprises a respective photodiode for performing photoelectric conversion of a light quantity received by the pixel, a respective JFET (junction-type field-effect transistor) for amplifying the charge accumulated in the respective photodiode during the current frame and for storing a pixel-output signal accumulated during a previous frame. Each pixel also preferably comprises a respective MOS switch (or analogous component) for discharging the photodiode so as to perform an electronic shutter function with respect to the pixel, a respective MOS switch for shifting the charge accumulated in the respective photodiode to the gate electrode of the respective JFET, a respective MOS switch for discharging the photodiode output charge of a previous frame that is stored in the JFET, thereby performing a reset function, and a respective MOS switch to connect the output of the JFET to a respective vertical-readout line.

Each differential-processing circuit preferably comprises a capacitor and a pair of MOS switches. One side of the capacitor is tied to a respective vertical-readout line. The other side of the capacitor is tied to a reference potential through one of the MOS switches, and to a horizontal-readout line through the other MOS switch.

The foregoing and additional features and advantages of the invention will be more readily apparent from the following detailed description, which proceeds with reference to the accompanying drawings.

DETAILED DESCRIPTION

This invention is described below in connection with multiple example embodiments.

EXAMPLE EMBODIMENT 1

Figure 1:
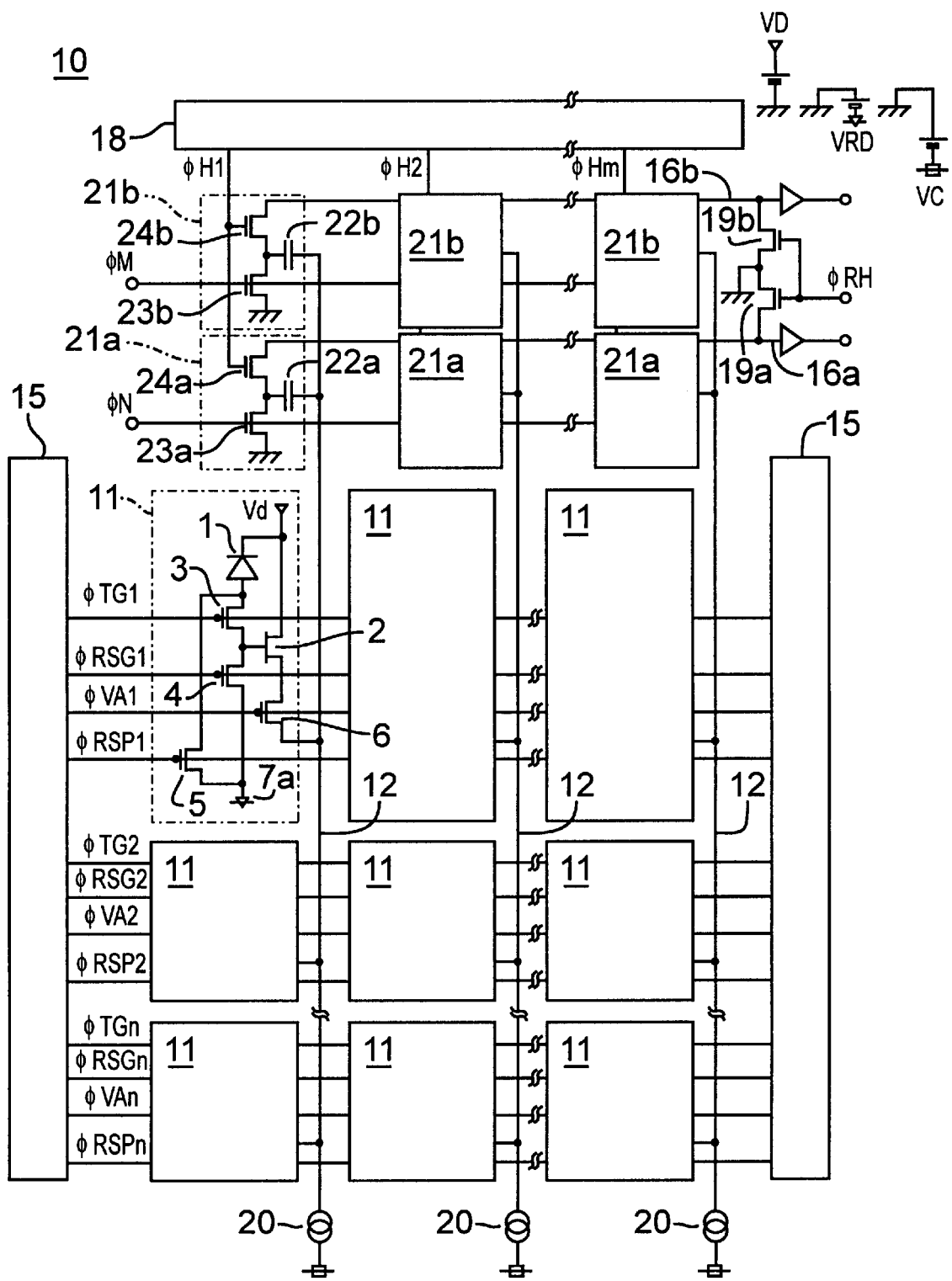
FIG. 1 is a schematic diagram of an electrical circuit configuration for a solid-state image-pickup device (SSIPD) according to Example Embodiment 1 of the invention.

A schematic diagram showing the electrical circuit configuration of a motion-detection solid-state image pickup device (SSIPD) according to this example embodiment is shown in FIG. 1. Multiple pixels 11 are arranged in a horizontal and vertical planar array comprising n rows and m columns on a light-receiving surface of the SSIPD. For simplicity, a representative 3×3 pixel configuration is shown; an actual device according to this example embodiment and Example Embodiment 2 typically comprises tens of thousands of pixels. The output signals for all the pixels in each column are commonly connected to a respective vertical-readout line 12. A separate vertical-readout line 12 is provided for each of the m columns of pixels.

A vertical-transfer circuit 15 provides timing signals to the pixels 11 for controlling the vertical transfer of the pixel-output signals for each row of pixels 11. The vertical-transfer circuit 15 provides a set of four control pulses, $\phi$TGi, $\phi$RSGi, $\phi$VAi, $\phi$RSPi to each of the pixels 11 in each of the n rows of pixels 11, wherein i is an integer denoting a respective row number. For example, the vertical-transfer circuit 15 provides the control pulses $\phi$TG1, $\phi$RSG1, $\phi$VA1, $\phi$RSP1 to each of the pixels 11 in the first row; provides the control pulses $\phi$TG2, $\phi$RSG2, $\phi$VA2, $\phi$RSP2 to each of the pixels 11 in the second row; and provides the control pulses $\phi$TGn, $\phi$RSGn, $\phi$VAn, $\phi$RSPn to each of the pixels 11 in the $n^{th}$ row. In situations where the number of pixels in a row is large, there may be problems with control-pulse propagation delays and/or a loss in signal quality. In such instances, it is desirable to provide a pair of vertical-transfer circuits 15 individually placed on opposite sides of the pixel array, as shown in FIG. 1. When dual vertical-transfer circuits 15 are used, they are preferably synchronized relative to each other so that they simultaneously output identical control pulses.

Each of the m vertical-readout lines 12 is connected to a respective current source 20, a respective differential-processing circuit 21a, and a respective body-motion-detection circuit 21b. The current sources 20 provide a bias current to the respective vertical-readout lines 12.

A control pulse $\phi$N is commonly connected to the sampling control terminals of each of the m differential-processing circuits 21a. The control pulse $\phi$N may be supplied by the vertical-transfer circuit 15, or by another appropriate circuit (not shown) that can be a part of the device. The output signals from the m differential-processing circuits 21a, which are used to form an image signal, are commonly connected to a horizontal-readout line 16a. The image signal conducted by the horizontal-readout line 16a is output through a suitable video amplifier circuit or the like.

Similarly, a control pulse $\phi$M is commonly connected to the sampling control terminals of each of the m body-motion-detection circuits 21b. The control pulse $\phi$M may be supplied by the vertical-transfer circuit 15, or by another appropriate circuit (not shown) that can be a part of the device. The output signals from the m body-motion-detection circuits 21b, which are used to form a motion-detection signal, are commonly connected to a horizontal-readout line 16b. The motion-detection signal conducted by the horizontal-readout line 16b is output through a suitable video amplifier circuit or the like.

A horizontal-transfer circuit 18 is used to provide timing signals to the differential-processing circuits 21a and to the body-motion-detection circuits 21b. The horizontal-transfer circuit 18 provides a control pulse $\phi$H1 that is connected to both the differential-processing circuit 21a in the first column and a horizontal-control terminal of the body-motion-detection circuit 21b in the first column. Similarly, control pulses $\phi$H2 through $\phi$Hm are individually connected to respective differential-processing circuits 21a and respective horizontal-control terminals of respective body-motion-detection circuits 21b.

MOS reset switches 19a and 19b are connected to the respective horizontal-readout lines 16a and 16b. A reset-use control pulse $\phi$RH is supplied to the respective gates of these MOS reset switches 19a and 19b. The reset-use pulse $\phi$RH may be output from the horizontal-transfer circuit 18, or from another appropriate circuit (not shown). Furthermore, although not shown in FIG. 1, MOS reset switches may be connected to the vertical-readout lines 12 to shunt any charge on the vertical-readout lines 12 to ground whenever the MOS reset switches are closed.

A detailed schematic of the specific circuit configuration of a representative pixel 11 (located at row 1, column 1) is shown in FIG. 1. The pixel 11 comprises a buried photodiode 1. The cathode of the photodiode 1 is connected to a positive power supply Vd. The anode of the buried photodiode 1 is connected to the gate of a JFET (unction-type field-effect transistor) 2 via a charge-transfer MOS switch 3. The control pulse $\phi$TG1 output from the vertical-transfer circuit 15 is supplied to the gate of the charge-transfer MOS switch 3.

The gate of the JFET 2 is connected to a metal conductor 7a via a signal-charge-reset MOS switch 4. The conductor 7a is maintained at a uniform reset electrical potential. The control pulse φRSG1, output from the vertical-transfer circuit 15, is supplied to the MOS switch 4. Furthermore, a charge-elimination MOS switch 5 is situated between the anode of the photodiode 1 and the conductor 7a, so that the anode of the photodiode 1 can be reset to a uniform reset electrical potential, bypassing the MOS switches 3, 4. The control pulse φRSP1, output from the vertical-transfer circuit 15, is supplied to the gate of the MOS switch 5.

The source of the JFET 2 is connected to the vertical-readout line 12 via a vertical-transfer MOS switch 6. The control pulse φVA1, output from the vertical-transfer circuit 15, is supplied to the gate of the MOS switch 6. The drain of the JFET 2 is connected to Vd.

While only the detailed circuit configuration of the pixel 11 in the first column and first row is described above, it will be appreciated that each of the other pixels 11 in the planar array has a similar circuit configuration, with the only differences being the particular control pulses φTGi, φRSGi, φVAi, φRSPi received by each pixel, wherein i denotes the particular horizontal row number of the pixel.

FIG. 1 also shows the circuit configuration of the differential-processing circuit 21a, that is connected to the vertical-readout line 12 in the first column, preferably just above the pixel 11 in the first row and first column. One end of a capacitor 22a is connected to the vertical-readout line 12 in the first column. The capacitor 22a holds the dark-signal output from the pixels 11 in the first column. A MOS switch 23a and a horizontal-transfer MOS switch 24a are connected to the other end of the capacitor 22a. The MOS switch 23a connects the capacitor 22a to a uniform electrical potential, such as ground, whenever the MOS switch 23a is closed. The opposite side of the MOS switch 24a is connected to the horizontal-readout line 16a. A control pulse φN is supplied as a control input to the MOS switch 23a. Similarly, a control pulse φHI, output from the horizontal transfer circuit 18, is supplied as a control input to the MOS switch 24a.

It will be appreciated that the other differential-processing circuits 21a connected to respective $2^{nd}$–$n^{th}$ vertical-readout lines 12 have circuit configurations that are similar to the circuit configuration of the differential-processing circuit 21a described above. The only difference is the particular control pulse φHi received by each differential-processing circuit. For instance, the control pulse for the differential-processing circuit 21a in the second column is denoted φH2.

Next, the circuit configuration of the body-motion-detection circuit 21b connected to the vertical-readout line 12 in the first column will be described. One end of a capacitor 22b is connected to the vertical-readout line 12 in the first column. The capacitor 22b holds the electrical signal produced by the pixels in the first column during the image frame just prior to the current image frame, hereinafter referred to as the "previous frame." A MOS switch 23b and a horizontal-transfer MOS switch 24b are connected to the other end of the capacitor 22b. The opposite side of the MOS switch 23b is tied to a uniform electrical potential, such as ground. The opposite side of the horizontal-transfer MOS switch 24b is connected to the horizontal-readout line 16b. A control pulse φM is supplied to the MOS switch 23b. A control pulse φH1 output from the horizontal-transfer circuit 18 is connected to the horizontal-transfer MOS switch 24b.

It will be appreciated that the other body-motion-detection circuits 21b connected to the $2^{nd}$–$n^{th}$ vertical-readout lines 12 have circuit configurations that are similar to the body-motion-detection circuit 21b described above; the only difference is the particular control pulse φHi received by each body-motion-detection circuit. For instance, the control pulse for the body-motion-detection circuit 21b in the second column is φH2.

The Semiconductor Structure of the Pixels

Figure 2:
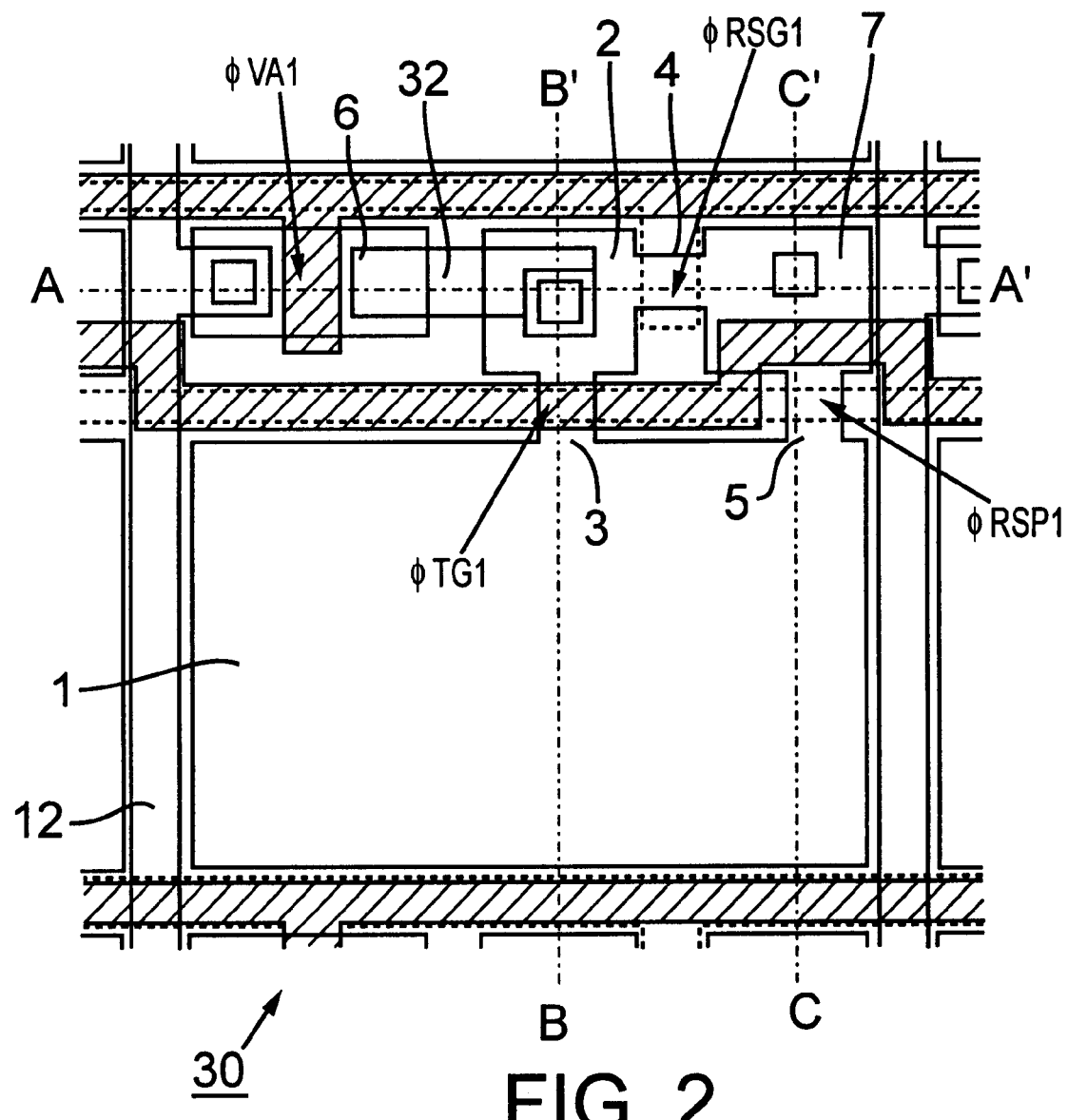
FIG. 2 is a plan view of a representative pixel in the FIG.-1 embodiment.
Figure 3A:
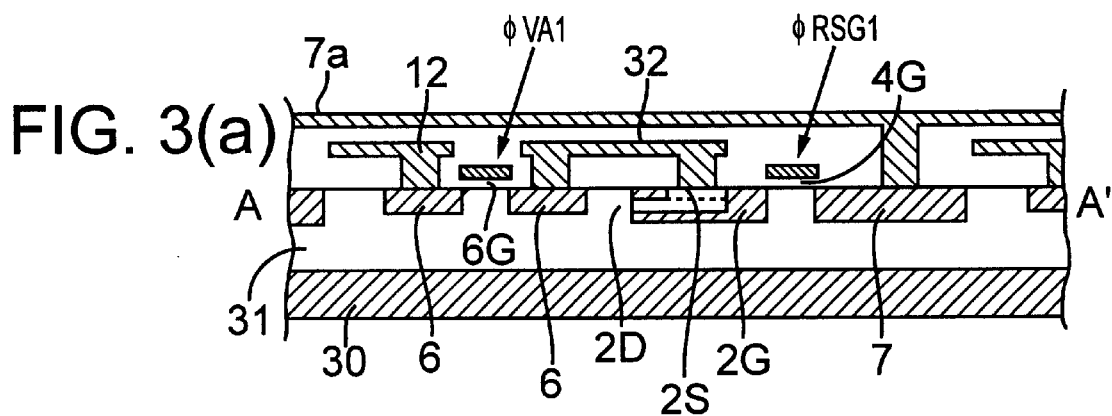
FIG. 3(a) is an elevational section, along the line A–A', of the pixel of FIG. 2.

The semiconductor structure of the pixels 11 is described below, with reference to FIG. 2 and FIGS. 3(a)–3(c). FIG. 2 is a plan view of the semiconductor structure of the pixels 11. FIG. 3(a) is an elevational section along the line A–A' of FIG. 2, FIG. 3(b) is an elevational section along the line B–B' of FIG. 2, and FIG. 3(c) is an elevational section along the line C–C' of FIG. 2.

Figure 3B:
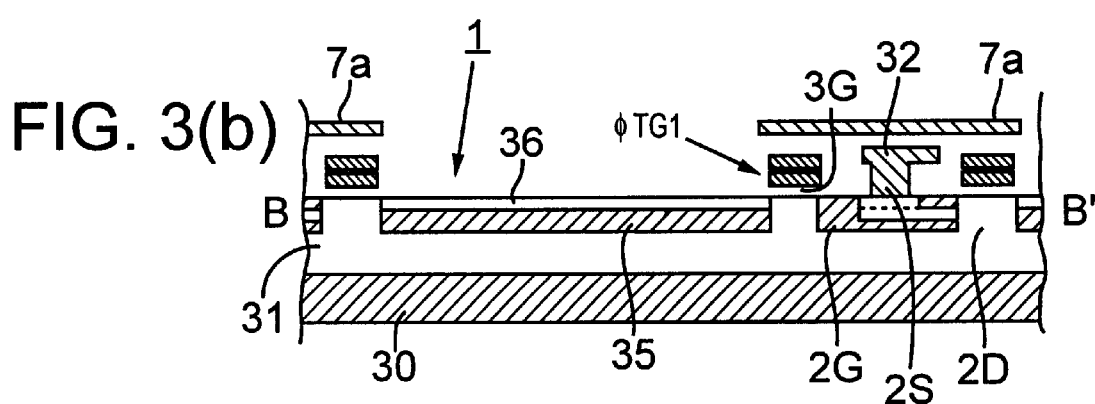
FIG. 3(b) is an elevational section, along the line B–B', of the pixel of FIG. 2.
Figure 3C:
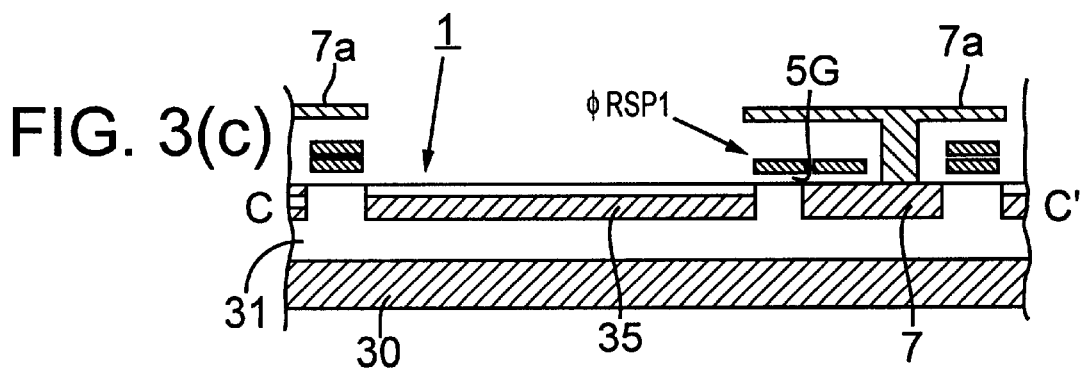
FIG. 3(c) is an elevational section, along the line C–C', of the pixel of FIG. 2.

As shown in FIG. 3(b), the pixel 11 is formed in an n-type region 31 that is formed on the main surface side of a substrate 30. A p-type storage region 35 is formed near the surface of the substrate 30, in the center of the n-type region 31. A thin n-type region 36, which prevents depletion of the oxide film interface, is located on the upper surface of the p-type storage region 35. The buried photodiode 1 is formed by the pn junction formed around the p-type storage region 35.

The gate region 2G of the JFET 2 is positioned adjacent the p-type storage region 35, separated by a gate region 3G of the charge-transfer MOS switch 3. The n-type region corridor that connects the JFET 2 source 2S and drain 2D is situated inside this gate region 2G. A polysilicon (or other suitable material) wiring layer, to which control pulses φTG1 are applied, passes directly above the gate region 3G of the MOS switch 3, and is separated from the gate region 3G by an oxide film.

As shown in FIG. 3(a), the drain 2D of the JFET 2 is in direct contact with the n-type region 31 and is maintained at a specific electrical potential. The source 2S of the JFET 2 is connected to one of the main electrodes (here the p-type region) of the vertical-transfer MOS switch 6 via a wiring conductor 32. A polysilicon (or other suitable material) conductive layer, to which control pulses φVA1 are applied, passes directly above the gate region 6G of the MOS switch 6, and is separated from the gate region 6G by an oxide film. The other main electrode of the MOS switch 6 (here the p-type region) is connected to the wiring conductor that forms the vertical-readout line 412. An elimination-use drain (dumping) element 7 is situated adjacent the gate region 2G of the JFET 2 via the gate region 4G of the MOS switch 4. A polysilicon (or other suitable material) wiring layer, to which control pulses φRSG1 are applied, passes directly above the gate region 4G of the MOS switch 4 and is separated from the gate region by an oxide film.

As shown in FIG. 3(c), the gate region 5G of the MOS switch 5 is situated between the elimination-use drain element 7 and the p-type storage region 35. A polysilicon (or other suitable material) wiring layer, to which control pulses φRSP1 are applied, passes directly above the gate region 5G of the MOS switch 5 and is separated from the gate region by an oxide film.

In this way, the elimination-use drain element 7 forms a common drain for the MOS switch 4 and the MOS switch 5. The elimination-use drain element 7 maintains a uniform reset potential through the metal conductor 7a. Furthermore, as shown in FIGS. 3(a)–3(c), the metal conductor 7a also serves as a light-shielding film and is shaped to cover all regions except for the light-sensing element of the photodiode 1. (The metal conductor 7a is not shown in FIG. 2 for clarity with respect to other details).

Operation of Example Embodiment 1

Figure 4:
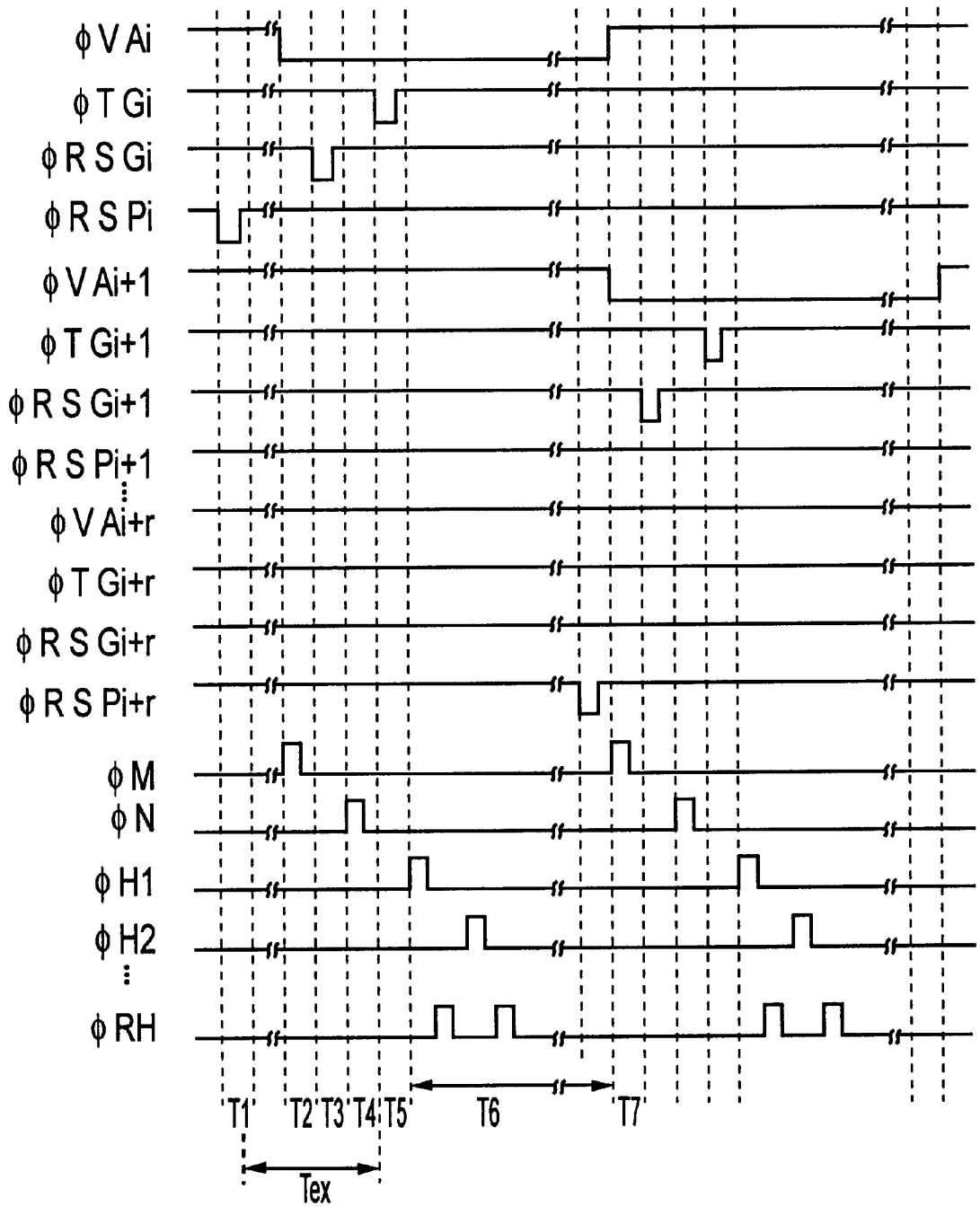
FIG. 4 is a representative pulse-timing chart for the FIG.-1 embodiment.

FIG. 4 is a timing chart showing the pulse timing of Example Embodiment 1. FIG. 4 shows the pixel column readout beginning with the $i^{th}$ horizontal row.

During a first period T1, the control pulse φRSPi is switched to a low logic level ("low"). When φRSPi is switched low, the MOS switches 5 of the pixels 11 in the i$^{th}$ row are closed, connecting the photodiodes 1 to the metal conductor 7a, which is maintained at a uniform reset potential. As a result, the residual charges stored in the photodiodes 1 of the pixels in the i$^{th}$ row are discharged into the metal conductor 7a, thereby resetting the photodiodes 1 in preparation for outputting the image from the current frame. Thus, the MOS switches perform an "electronic shutter" function.

Toward the end of timing period T1, the control pulse φRSPi is returned to a high logic level ("high"), whereby the MOS switches 5 are opened. This permits the pixels 11 of the i$^{th}$ horizontal row to begin storing a signal charge that is a measure of the light being sensed by the photodiode 1.

Next, at the start of the period T2, the control pulse φVAi is switched to low as the control pulse φM is simultaneously switched to high. This initiates the verticaltransfer sequence of the i$^{th}$ row. Switching the control pulse φVAi to low closes the MOS switches 6 of the i$^{th}$ row of pixels 11. At this time, the charge stored during readout of the preceding frame remains in the gate region 2G of the JFET 2. As a result, the signal charges accumulated in the pixels 11 in the i$^{th}$ row during the previous frame are output to the vertical-readout line 12 by source-follower action of the JFET 2. At the same moment, the MOS switch 23b in the body-motion-detection circuit 21b is closed by the pulse φM, thereby forming a charging path through the capacitor 22b. As a result, the signal charges from the previous frame of pixels 11 in the i$^{th}$ row charge the capacitors 22b in the body-motion-detection circuits 21b. At about the end of the period T2, the control pulse φM is switched back to low, causing one end of the capacitors 22b to return to a floating state. This results in the accumulated charge being held in the capacitor 22b.

The control pulse φRSGi is next switched to low in the period T3, which closes the MOS switches 4 in the pixels 11 of the i$^{th}$ row. This results in dumping the signal charge stored in the gate region 2G of the JFET 2 into the metal conductor 7a. This signal charge represents the output of the photodiode 1 during the previous frame. As a result, the gate region 2G is reinitialized to a reset voltage through the metal conductor 7a. Then, since the MOS switch 6 is still closed (because the control pulse VAi is still low), the voltage variations ("dark signals")generated between the gate sources of the JFETs 2 in the i$^{th}$ row are output to the vertical-readout lines 12.

MOS switches 23a in the differential-processing circuit 21a. As a result, a charging path passing through the capacitors 22a is formed and the dark signals of the pixels in the i$^{th}$ row are charged into the capacitors 22a inside the differential-processing circuits 21a. The control pulse φN is switched back to low just prior to the end of the period T4, thereby opening the MOS switches 23a so as to cause one end of the capacitors 22a to re-enter a floating state. As a result, the dark signals of the pixels in the i$^{th}$ row are preserved as corresponding voltages across the capacitors 22a.

During the period T5, the control pulse φTGi is switched to low, thereby closing the MOS switches 3 in the pixels 11 of the i$^{th}$ row. As a result, the signal charges of the current frame, which are stored in the photodiodes 1, are transferred to the gate regions 2G of the JFETs 2 of the pixels 11 in the i$^{th}$ row. Since the control pulse φVAi is still low (thereby maintaining a conductive path across the MOS switch 6), the output signals of the pixels 11 in the i$^{th}$ row obtained during the current frame are output onto the vertical-readout lines 12.

During the period T6, the control pulses φH1–φHm of the horizontal-transfer circuit 18 are sequentially switched to high, and then reset back to low. The timing of this sequential switching is set so that a first control pulse φH is switched from low to high and back to low again, followed by a reset period. This is followed by a second control pulse φH being switched from low to high and back to low again, followed by a second reset period, etc., as shown in the lower portion of FIG. 4. The control pulses φH1–φHm are connected to the respective gates of the MOS switches 24a, 24b; when the control pulses go high these MOS switches are closed. As each of the MOS switches 24b in columns 1–m is sequentially closed, one side of the respective capacitors 22b is sequentially connected to the horizontal-readout line 16b.

When pixel outputs from the current frame are transferred to the vertical-readout lines 12 during the period T5, the voltages that appear at the right-hand terminals of the capacitors 22b are equal to the respective pixel-output signals for the row that is presently being processed (i.e., row i). Since both φM and φN are low at this point, both MOS switches 23b, 24b are open; this causes the left sides of the capacitors 22b to assume a floating state. Thus, a change in voltage on the vertical-readout lines 12 does not affect the potentials across the plates of the capacitors 22b. Upon the closing of each respective MOS switch 24b (by φHi going high), the left sides of the capacitors 22b are no longer floating, but rather are connected in sequence to the horizontal-readout line 16b. At the output end of the readout line 16b is an amplification circuit that provides a high input impedance.

The impedance of a capacitor approaches zero at very high frequencies. A capacitor cannot react instantaneously to a voltage change across its inputs. Therefore, when a capacitor having a potential across its plates is connected in series with a different voltage potential across its terminals, the instantaneous voltage passing through the capacitor is the difference between the potentials. Thus, when the MOS switches 24b are closed in response to the respective φHi signals output by the horizontal-transfer circuit 18, the signal passing through the capacitors 22b onto the horizontal-readout line 16b is equal to the difference between the voltage stored across the capacitor plates (the output signal from the previous frame) and the voltage on the respective vertical-readout line 12 (the output signal from the current frame). This differential signal is read out on the horizontal-readout line 16b as a motion-detection signal.

Similarly, during this same period of time, the voltage potentials across the capacitors 22a (representing the stored dark signals) reduce the signal voltages output by the pixels 11 in the i$^{th}$ row during the current frame. Consequently, the signal voltages sequentially read out on the horizontal-readout line 16a represent the pixel outputs, with the dark signals removed, of the current frame.

During the reset-timing period, φRH is momentarily switched to high. When φRH is switched to high, the gates of the MOS reset switches 19a and 19b are energized, thereby connecting both horizontal-readout lines 16a and 16b to a reference potential, such as ground. This causes residual charges on the horizontal-readout lines 16a and 16b to be dumped to the reference potential, thereby preparing the horizontal-readout lines for transfer of the output signal of the next pixel 11. Thus, there is no mixing of residual charges with the horizontally transferred motion-detection signals and image signals. By this process, it may be possible to perform zero$^{th}$-hold sequences by using a video-amplification circuit connected to the horizontal-readout lines 16a and 16b.

A single frame of the motion-detection signal and the image signal can be output by repeating the above-described series of timing steps while scanning the row of pixels 11 being read out from the first row through the $n^{th}$ row. These signals can then be processed externally for display or other purposes.

Further explanation regarding the exposure period Tex is presented below. Toward the end of the period T6, just before the pixels 11 in the $(i+1)^{th}$ row are to be read out, the control pulse φRSPi+r is switched to low. This causes residual charges stored in the photodiodes 1 of the pixels 11 in the $(i+r)^{th}$ row to be discharged. These photodiodes store the signal charge from the moment of this discharge until the beginning of readout of the $(i+r)^{th}$ row. Therefore, the exposure time (Tex) of Example Embodiment 1 is nearly equal to the time required to read out r−1 rows of pixels. The control pulses φRSP1–φRSPn are output from the vertical-transfer circuit 15 so that the exposure time Tex is uniform for all pixels 11.

In this example embodiment, the body-motion-detection circuit 21b measures the difference between the electrical charge output by the pixels 11 during a first frame (i.e., the previous frame), and the electrical charge output by the pixels during the immediately subsequent frame (i.e., the current frame). This measurement is repeated for each additional subsequent frame so that the motion-detection signals are continuously read out on the horizontal-readout line 16b. Thus, this example embodiment requires no A/D converters, image memory, image-processing circuits, or other peripheral circuits external to the SSIPD in order to perform motion detection. As a result, this example embodiment provides a SSIPD that is smaller and lower in cost compared to conventional devices.

Since this example embodiment does not require an A/D converter, the full signal bandwidth of the SSIPD is available for performing motion detection. Furthermore, since a comparator is not required for each pixel, the semiconductor surface area required to produce each pixel is smaller than the area that would be required if a comparator circuit at each pixel were required. Thus, this example embodiment provides a device with improved aperture ratio and resolution compared to the prior art.

Another benefit provided by this example embodiment is that the electrical signals of the current and preceding frames are compared without any image-position phase shift. This avoids the phase-shift problem exhibited by certain conventional devices and results in improved motion detection.

This example embodiment also facilitates the use of a reliable electronic shutter function that does not adversely affect motion detection. During the period in which the charge-transfer MOS switch 3 is open, the residual charge in the photodiode 1 is discharged immediately through the charge-elimination MOS switch 5. This resets the output signal of the photodiode 1, and, since this period is part of the timing cycle, creates a predetermined exposure time for each pixel. Furthermore, this reset operation has no effect on motion detection.

Conventional devices, in contrast, do not have a resetting function capable of resetting residual charges in the photodiodes without destroying the stored charges corresponding to the previous frame. Consequently, conventional devices cannot control the speed of an electronic shutter function for the current frame. Further with respect to conventional devices, it is especially difficult to accurately detect the position of a moving body based on differences between sequential frames in cases where the motion of the body is rapid. In such instances, the image is observed to "slip" past due to the rapid movement of the body. The use of an electronic shutter can minimize such image "slip" and thereby produce a more accurate motion-detection signal.

This example embodiment provides a simultaneous output of both the motion-detection signal and the image signal. Processing of each of these signals is independent of other signal processing. Simultaneous output of these two types of signals is well suited to applications where motion detection is necessary while observing (recording) images, as is done with monitoring devices.

This example embodiment also produces an output signal from which the dark signals are removed. By use of the differential-processing circuit 21a, the dark signals of the pixel outputs can be subtracted out, yielding a high-quality image signal.

EXAMPLE EMBODIMENT 2

Figure 5:
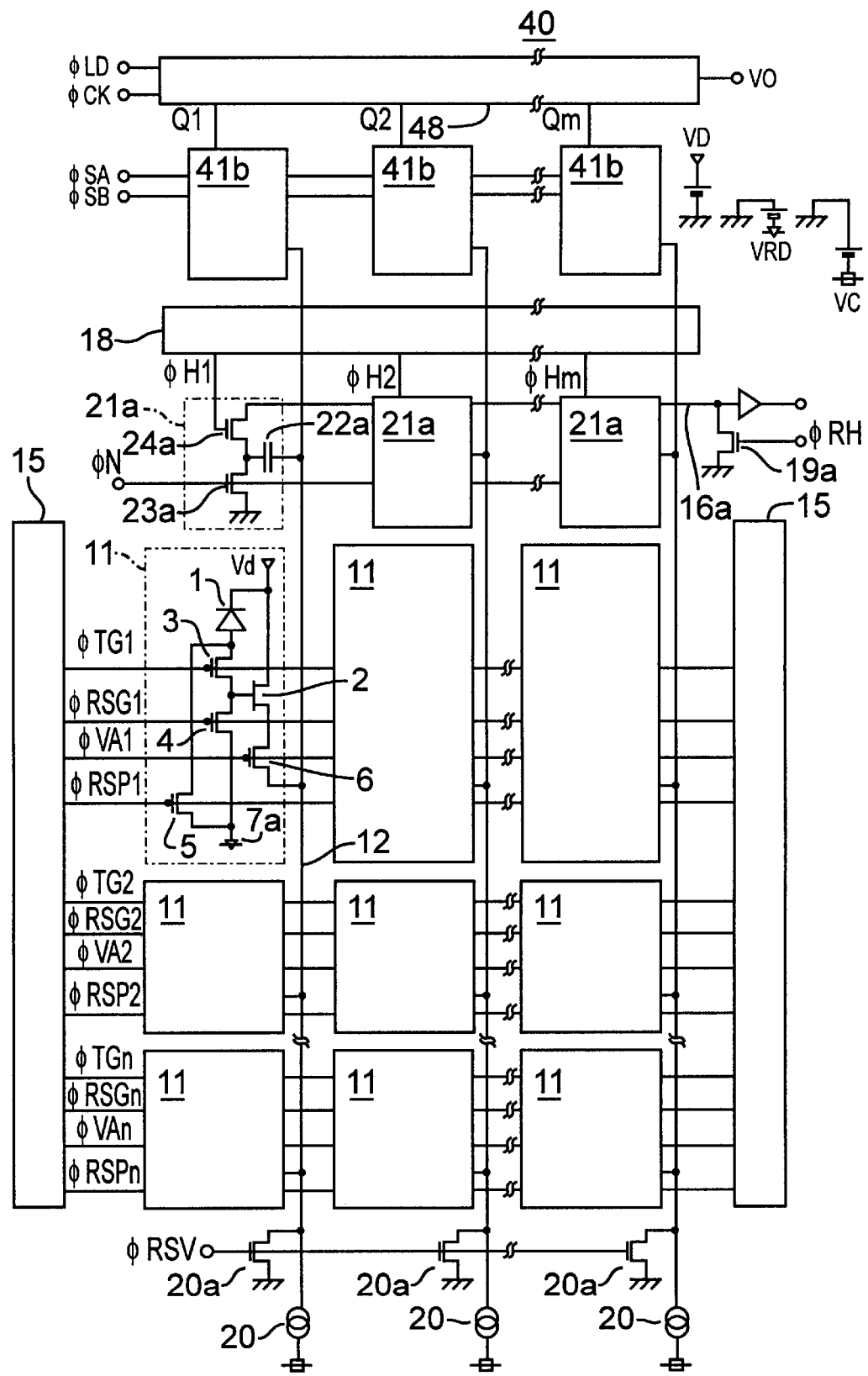
FIG. 5 is a schematic diagram of an electrical circuit configuration for a SSIPD according to Example Embodiment 2 of the invention.

A schematic diagram showing the electrical circuit configuration of a SSIPD exhibiting motion detection according to this example embodiment is shown in FIG. 5. In FIG. 5, the pixels 11 are arranged in a horizontal and vertical planar array comprising n rows by m columns on the light-receiving surface of a SSIPD 40. The output signals of the pixels 11 in each column are connected to respective vertical-readout lines 12.

Most of the circuit shown in FIG. 5 is similar to tie circuit configuration for Example Embodiment 1 discussed above and shown in FIG. 1. The components that are similar in both FIGS. 1 and 5 have the same reference numerals, including the pixels 11, the vertical-readout lines 12, the vertical-transfer circuit 15, the current source 20, the differential-processing circuit 21a, the horizontal-transfer circuit 18, and the horizontal-readout line 16a. The configuration of each pixel 11 is similar to that discussed above in Example Embodiment 1. Likewise, the configuration of the differential-processing circuit 21a is similar to the differential-processing circuit 21a described in Example Embodiment 1.

As in Example Embodiment 1, the vertical-transfer circuit 15 is used for controlling the vertical-transfer timing of the output signals from the pixels 11. The four control pulses, φTG1, φRSG1I, φVA1, φRSP1, are supplied to the pixels in the first row by the vertical-transfer circuit 15. Similarly, the vertical-transfer circuit 15 provides the control pulses, φTG2–n, φRSG2–n, φVA2–n, φRSP2–n, for the pixels 11 in the $2^{nd}$ through $n^{th}$ rows. A pair of synchronized vertical-transfer circuits 15 is preferably used whenever the number of pixels in each of the rows is large, as discussed above in Example Embodiment 1.

The electrical current source 20 (that supplies a bias current), the differential-processing circuit 21a, a difference-detection circuit 41b, and the reset MOS switch 20a are each connected to a respective vertical-readout line 12.

The control pulses φN are supplied in common to the sampling-control terminals of the m differential-processing circuits 21a. The control pulses φN may be supplied by the vertical-transfer circuit 15 or by a separate control circuit (not shown). The output terminals of the m differential-processing circuits 21a are commonly connected to form the image-signal horizontal-readout line 16a. The image signals output to the horizontal-readout line 16a are output to an external circuit of the motion-detection SSIPD 40 via an internal video-amplifier circuit and/or other circuits (not shown).

The MOS reset switch 19a is connected to the horizontal-readout line 16a. The reset-use control pulse φRH is supplied to the gate of the MOS reset switch 19a, thereby controlling the opening and closing of the MOS reset switch 19a. The control pulse φRH may be supplied by the horizontal-transfer circuit 18 or by a separate circuit (not shown).

The horizontal-transfer circuit 18 provides timing signals to the differential-processing circuits 21a. The control pulse φH1 is supplied by the horizontal-transfer circuit to the horizontal-control terminals of the differential-processing circuit 21a in the first column. Similarly, the control pulses φH2–KHm are supplied by the horizontal-transfer circuit 18 to each of the remaining differential-processing circuits 21a in the second through $m^{th}$ columns.

The control pulses φSA, φSB are supplied to the sampling-control terminals of the m difference-detection circuits 41b. The control pulses φSA, φSB may be provided by the vertical-transfer circuit 15 or by a separate circuit (not shown).

The output terminals Q of the m difference-detection circuits 41b are connected to the parallel inputs of a shift register 48. In order to determine the parallel data read-in timing, the control pulses φLD and the transfer clock φCK are input into the shift register 48. These pulses (φLD and φCK) may be supplied by the horizontal-transfer circuit 18 or by a separate circuit. The serial output of the shift register 48 is output to an exterior module of the motion-detection SSIPD 40 as a motion-detection signal.

Circuit Configuration of the Difference-Detection Circuit

Next, the specific circuit configuration of the difference-detection circuit 41b connected to the vertical-readout line 12 in the first column will be explained, with reference to FIG. 6(a).

Figure 6A:
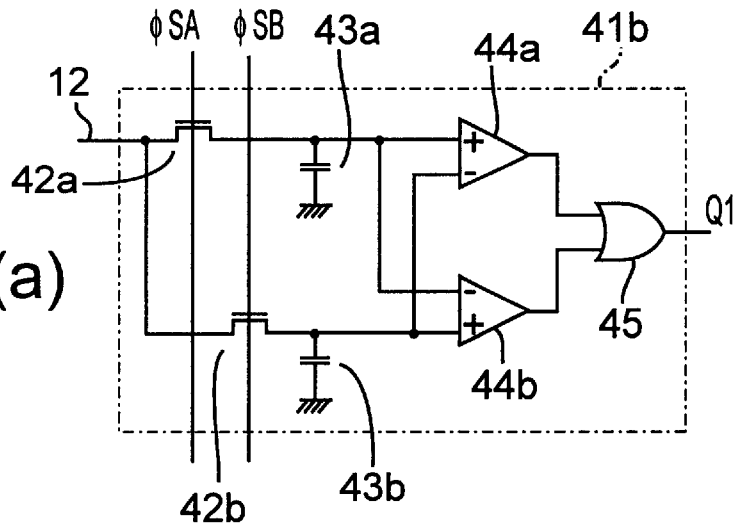
FIG. 6(a) is a detailed schematic diagram of the difference-detection circuit 41b of the FIG.-5 embodiment.

As shown in FIG. 6(a), one of the terminals of each of two MOS switches 42a, 42b is connected to the vertical-readout line 12 of the first column. The other terminal of the MOS switch 42a is connected to a voltage-maintenance capacitor 43a, to the positive-side input of a first comparator 44a, and to the negative-side input of a second comparator 44b. The other terminal of the MOS switch 42b is connected to a voltage-maintenance capacitor 43b, to the negative-side input of the first comparator 44a, and to the positive-side input of the second comparator 44b. Each of the outputs of the comparators 44a, 44b is input into an OR gate 45. The output of the OR gate 45 is supplied to a parallel input Q1 of the shift register 48.

Operation of Example Embodiment 2

Figure 7:
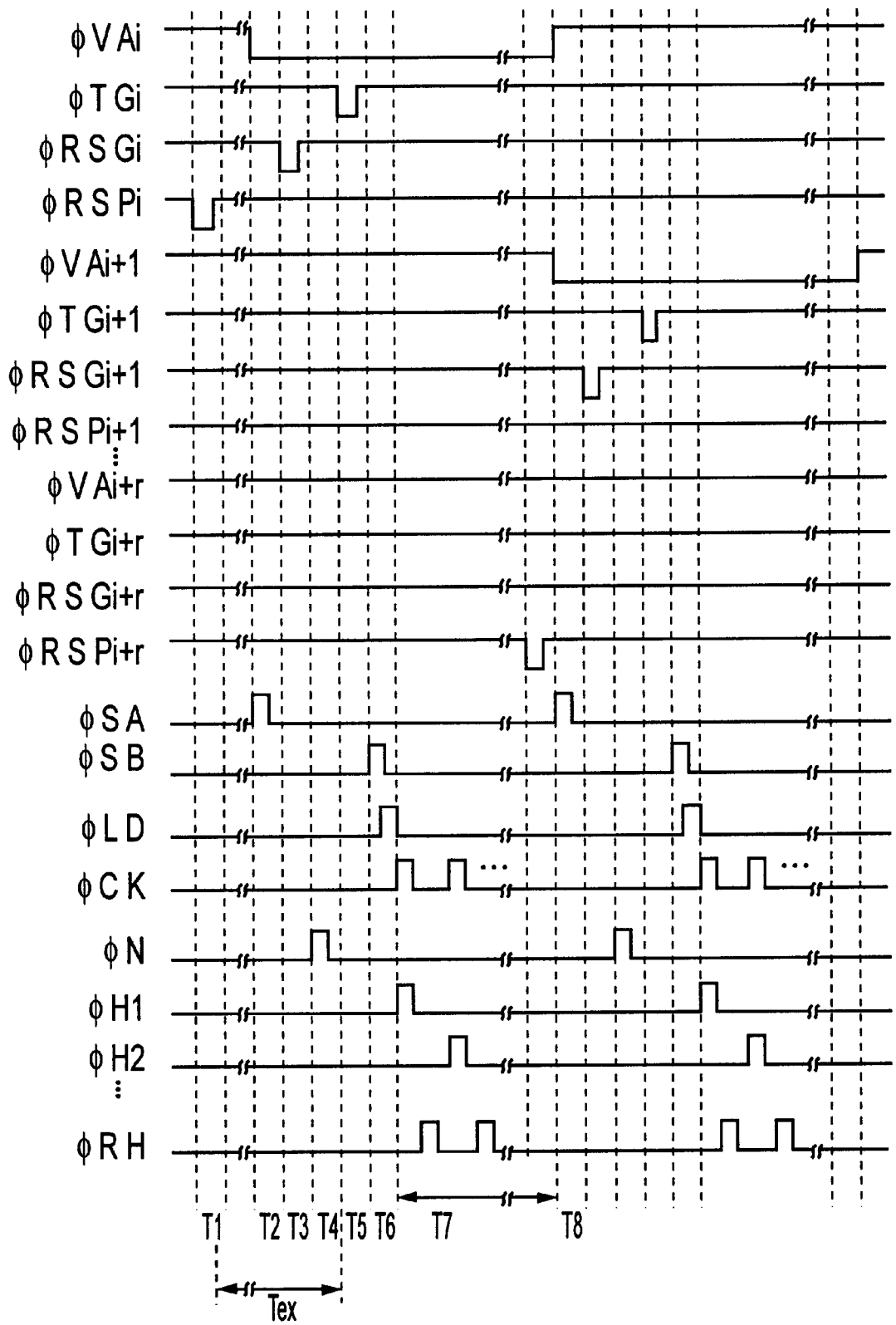
FIG. 7 is a representative pulse-timing chart for the FIG.-5 embodiment.
Figure 9:
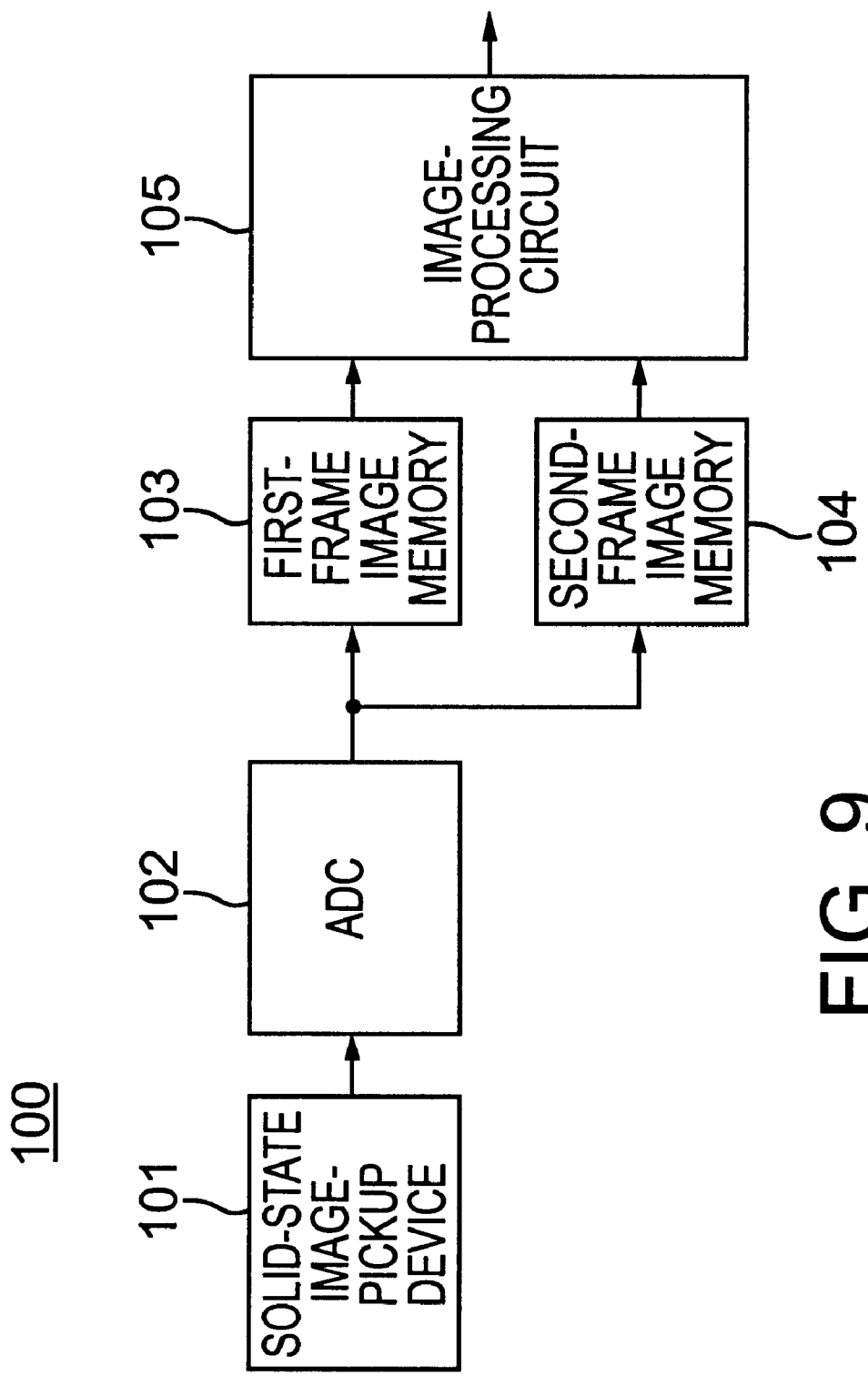
FIG. 9 is functional block diagram of a conventional SSIPD with motion-detection capability.

FIG. 7 is a timing chart showing the drive timing for Example Embodiment 2. FIG. 7 shows the timing of control signals during readout of the $i^{th}$ row of pixels, and during readout of rows subsequent to the $i^{th}$ row.

During a timing period T1, the control pulse φRSPi is switched to low. This closes the MOS switches 5 in the pixels 11 of the $i^{th}$ row, thereby discharging the residual charge stored in the photodiode 1 and performing an "electronic shutter" operation. Just before the end of the period T1, the control pulse φRSPi returns to high. As a result, the MOS switches 5 are returned to an open state in which the pixels 11 of the $i^{th}$ row begin to store the signal charges output by the photodiodes 1.

During a timing period T2, the control pulse φVAi is switched to low. This closes the MOS switches 6, thereby connecting the JFETs 2 to the vertical-readout lines 12. Simultaneously, the control pulse φSA is momentarily stepped to high, which closes the MOS switches 42a in the difference-detection circuits 41b and creates a charging path between the vertical-readout lines 12 and the capacitors 43a. As a result, the output signals of the pixels 11 in the $i^{th}$ row, corresponding to the preceding frame, charge the capacitors 43a. Just before the end of the period T2, the control pulse φSA is returned to low, thereby opening the MOS switches 42a and disconnecting the capacitors 43a from the vertical-readout lines 12. Thus, the output signals from the preceding-frame pixel 11 are stored in the capacitors 43a, thereby achieving a sample-and-hold function.

At the start of a timing period T3, the control pulse φRSGi is switched to low. This closes the MOS switches 4 in the pixels 11 of the $i^{th}$ row and results in a discharge of the signal charges (of the previous frame) that were held in the gate region 2G of the JFETs 2. As a result, the gate region 2G is initialized via the metal conductor 7a to its reset voltage. Meanwhile, the control pulse VAi remains low which keeps the MOS switches 6 closed. This results in the dark signals (voltage variations generated between the gates and sources in the JFETs 2) from the pixels 11 in the $i^{th}$ row being output to the vertical-readout lines 12.

The control pulse φN is switched to high at the start of the timing period T4. This closes the MOS switches 23a in the differential-processing circuits 21a and forms charging paths between the vertical-readout lines 12 and the capacitors 22a. As a result, the dark signals that were output to the vertical-readout lines near the end of the period T3 charge the capacitors 22a in the differential-processing circuits 21a. Just before the end of the period T4, the control pulse φN returns to low, which opens the MOS switches 23a, and causes one end of the capacitors 22a to return to a floating state. As a result, the dark signals of the pixels 11 in the $i^{th}$ row are held in the capacitors 22a.

The control pulse φTGi is switched to low at the start of the timing period T5. This closes the MOS switches 3 of the pixels 11 in the $i^{th}$ row, which permits the signal charge of the current frame stored in the photodiodes 1 to be transferred to the gate region 2G of the JFETs 2. Concurrently, the control pulse φVAi is held low, thereby maintaining a conductive path across the MOS switches 6. This allows the current-frame output signals of the pixels 11 in the $i^{th}$ row to pass to the vertical-readout lines 12.

The control pulse φSB is switched to high at the start of the timing period T6. This results in closing of the MOS switches 42b in the difference-detection circuits 41b, which creates a charging path that passes through the vertical-readout line 12 and into the capacitor 43b. The charging path allows the output signals of the pixels 11 in the $i^{th}$ row, corresponding to the current frame, to charge the capacitors 43b. This results in application of voltage potentials across the plates of the capacitors 43b. Just before the end of the period T6, the control pulse φSB returns to low, which disconnects the capacitors 43 from the vertical-readout lines 12. Thus, the current-frame output signals from the pixels 11 are stored in the capacitors 43b, thereby completing a sample-and-hold function.

Figure 6B:
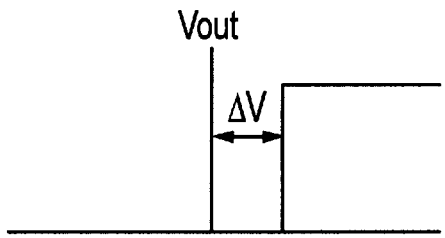
FIG. 6(b) is a plot of the input-output characteristics of the comparators 44a, 44b shown in FIG. 6(a).

The input-output characteristics of the comparators 44a, 44b are shown in FIG. 6(b). The ordinate (x-axis) represents the absolute value of the difference of the voltage at the plus input and the voltage at the minus input, i.e., the absolute value of the voltage differential across the capacitors 43a, 43b. If this absolute value of the voltage-input differential remains below a set threshold value of ΔV, then the outputs of the comparators are low. If the voltage-input differential exceeds the threshold value ΔV, then the output of the comparators goes high. The outputs from the comparators 44a, 44b serve as inputs for the OR gate 45. Hence, the output of the OR gate 45 is low if the comparators 44a, 44b output an absolute value of the voltage-input differential of less than the threshold value ΔV. If either of the comparators 44a, 44b determines that the absolute value of the voltage differential exceeds the threshold value ΔV, then the output of the OR gate 45 will be high. Thus, the output signals for the current frame and for the previous frame are compared for each pixel 11; if the difference between the signals exceeds the threshold value ΔV, then the motion-detection output Qi will be high.

At about the middle of the period T6, the control pulse φLD of the shift register 48 is switched to high, which causes each of the outputs Qi of the OR gates 45 to be read into a respective parallel input of the shift register 48.

During the timing period T7, the control pulses φH1–φHm of the horizontal-transfer circuit 18 are sequentially switched to high and then reset back to low. The timing of such sequential switching is set so that a first control pulse φH is switched from low to high and back to low again, followed by a reset-timing period, followed by a second control pulse φH being switched from low to high and back to low again, followed by a second reset-timing period, etc., as shown in the lower portion of FIG. 7. The control pulses φH1–φHm are connected to the gates of respective MOS switches 24a, causing these MOS switches to close when the control pulses go high. As each of the MOS switches 24a in columns 1–m is sequentially closed, conductive paths are formed that connect the vertical-readout lines 12 to the horizontal-readout line 16a through the capacitors 22a. In a manner similar to that described above for Example Embodiment 1, the voltages that pass through the capacitors 22a and onto the horizontal-readout line 16a are equal to the voltages on the vertical-readout lines 12 (the pixel outputs for the current frame) minus the voltage potentials across the plates of the capacitors 22a (the previously stored dark-signal outputs of the pixels). Thus, the resulting signal read out on the horizontal-readout line 16a as the control pulses φH1–φHm are sequentially switched to high is the output signals for the pixels 11 in the $i^{th}$ row minus their associated dark signals.

During the reset period, φRH is momentarily switched to high so as to energize the gates of the MOS switches 19a, thereby connecting the horizontal-readout line 16a to ground. This causes residual charges on the horizontal-readout line 16a to be dumped to ground, thereby preparing the readout lines for transfer of output signals from the next pixel 11. Thus, there is no mixing of the residual charges with the horizontally transferred image signals.

A transfer-clock signal φCK is switched synchronously with the switching of each of the control pulses φH1–φHm, as shown in the lower portion of FIG. 7. Hence, the transfer-clock signal φCK clocks the output VO of the shift register 48. As a result, each of the motion-detection "decisions" made by the difference-detection circuit 41b and stored in the shift register 48 during the period T6 is output horizontally as a sequence of binary (digitized) motion-detection signals.

A single frame of the motion-detection signal and the image signal can be simultaneously output by repeating the above-described series of steps while scanning the row of pixels 11 being read out from the first row through the $n^{th}$ row. These signals can then be processed externally for display or other purposes.

The output signals produced by Example Embodiment 2 are similar to the output signals produced by Example Embodiment 1, except that the motion-detection signal in Example Embodiment 1 is a voltage differential between frames on a pixel-by-pixel basis, while the motion-detection signal in Example Embodiment 2 is a binary (digital) stream of motion-detection measurements made on a pixel-by-pixel basis.

One notable effect of Example Embodiment 2 is that the difference-detection circuit 41b determines for each pixel whether or not the output signals of the preceding frame and the current frame are equivalent within an allowable range (here the threshold value ΔV). The difference-detection circuit then outputs the results of such determinations as a 1-bit digitized motion-detection signal. Since the output signal is already in digitized format, no external post-processing circuitry is required for motion-detection purposes. By incorporating use of the shift register 48 for horizontally transferring the difference-detection circuits 41b outputs, higher speeds can be achieved at lower noise levels, compared to circuitry that outputs analog motion-detection signals.

There are several component substitutions that can be made to the circuitry of the Example Embodiments 1 and 2. For example, the JFET 2 is used for both amplification and storage of a signal charge (the signal charge is stored in the gate region 2G of the JFET 2). This amplification and storage function could also be achieved by using separate amplification and storage devices. For instance, a MOS transistor or bipolar transistor could be substituted to serve the amplification function. The signal charge can be maintained as a parasitic capacitance generated in the gates or bases of the substitute amplification devices, or a supplementary capacitor can be added to the transistors to maintain the signal charge.

Substitutions can also be made with respect to the vertical-transfer MOS switch 6. In Example Embodiments 1 and 2, the vertical-transfer MOS switches 6 are used for connecting the stored signal charges to the vertical-readout lines. A capacitor can be added to store the signal charge that is present in the gates or bases of the amplification devices, whereupon the connection between the amplification device and the vertical-readout line can be opened and closed by raising or lowering the voltage on the side of the capacitor that is not connected to the gate or base.

In Example Embodiments 1 and 2, the signal charge generated in the photodiode is transferred directly into the control region of the amplification device (i.e., the JFET 2); however, the invention is not limited to such a scheme. For instance, after transferring and maintaining the signal charge in the diffusion region of the amplification device, the electrical potential of that diffusion region can be detected in the gate of a MOS transistor through the signal line. An example of such a pixel configuration is contained in Fossum, "Active Pixel Sensors: Are CCD's Dinosaurs?," *Proceedings of SPIE: Charge-Coupled Device and Solid State Optical Sensors III*, Vol. 1900, pp. 2–14 (1993).

In both example embodiments a two-dimensional pixel array is described. The invention can also be applied to a one-dimensional pixel array.

Another modification is shown near the bottom of FIG. 5. According to the modification, MOS switches 20a are provided for each respective vertical-readout line 12. The gates of the MOS switches 20a are connected to a control pulse φRSV which may be supplied by the vertical-transfer circuit 15 or by an extraneous circuit (not shown). As shown near the tops of the timing diagrams of FIGS. 4 and 7, the control pulses φVAi have a slight overlap, so that one of the pulses is always low. This timing can be modified so that a reset period (i.e., a period in which none of the pulses φVAi is low) occurs between the control pulses φVAi. During such a reset period, the level of the control pulse φRSV can be switched so as to close the MOS switches 20a, thereby shunting any residual charge on the vertical-readout lines 12 to a reference potential such as ground. Under normal conditions, a parasitic capacitance may exist on the vertical-readout lines due to various charges transferred onto these lines. Whenever the voltage on the vertical-readout lines is too high due to parasitic capacitance, the JFETs 2 do not function properly. This is because a sufficient voltage potential must exist from the drain to the source of the JFETs in order for the respective JFETs to be operational. It is necessary to lower this parasitic charge voltage with the current sources 20; however, this is time-consuming.

The time required to discharge parasitic voltages on the vertical-readout lines 12 can be greatly reduced by using the reset MOS switches 20a. Since, according to such a scheme, closing of the MOS switches 20a shunts the undesired charges to a reference potential, reset is very fast. This facilitates a significant increase in the speed with which vertical-line readout can be performed.

Figure 8:
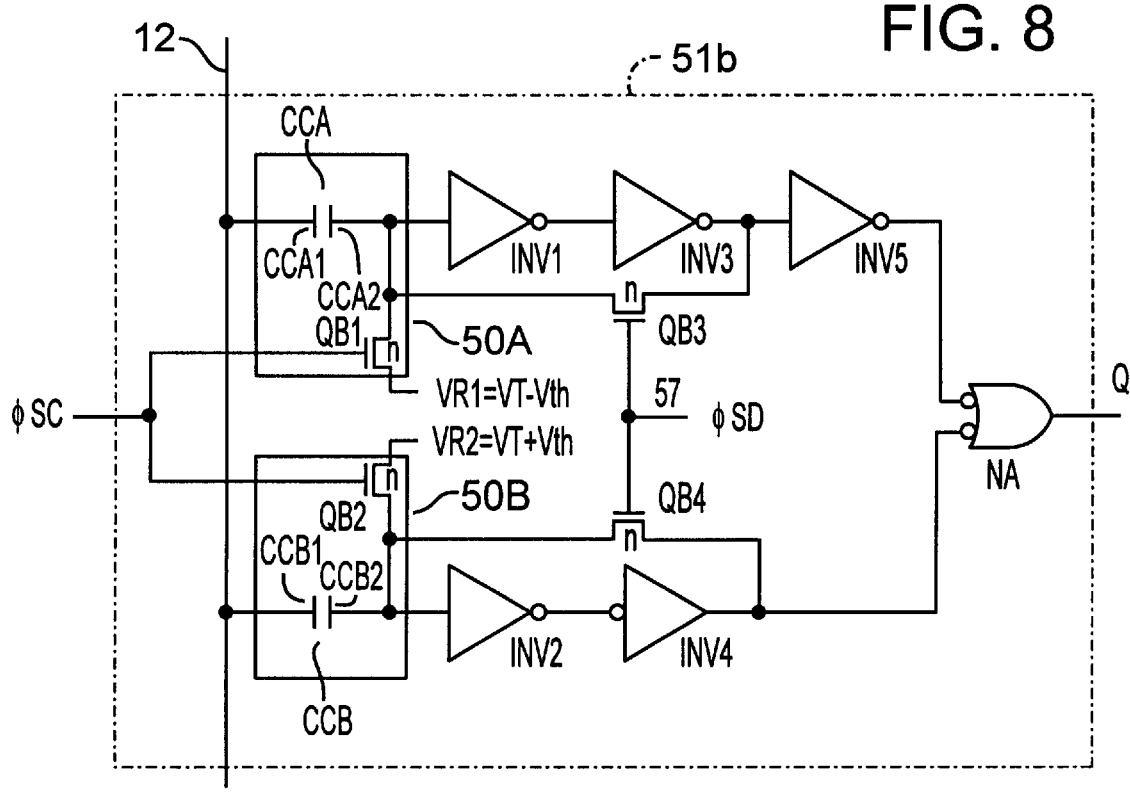
FIG. 8 is a detailed schematic diagram of an alternative difference-detection circuit of the FIG.-5 embodiment.

As discussed below, a substitute circuit may replace the difference-detection circuit 41b. In general, any circuit that can determine whether a pair of electrical input signals matches each other within a predetermined range may suitably perform the function of the difference-detection circuit 41b. An example of such a circuit 51b is shown in FIG. 8. The alternative difference-detection circuit 51b operates as follows. First, the control pulse φSC is switched to high momentarily while the pixel outputs of the preceding frame ($V_{old}$) are on the vertical-readout lines 12. This closes the MOS switches QB1 and QB2 and creates a charging path across the capacitors CCA and CCB. As a result, the voltage potential across the capacitor CCA is ($V_{old}$–(VT–Vth)), wherein VT represents a threshold voltage internally set in the inverters INV1 and INV2, and Vth represents a threshold that is used for determining motion detection. At the same time, the voltage potential across the capacitor CCB is ($V_{old}$–(VT+Vth)).

During a subsequent timing period, the pixel-output signals of the current frame are routed to the vertical-readout lines 12. The voltage passing through the capacitors CCA, CCB is equal to the voltage on the vertical-readout lines 12 ($V_{now}$) minus the potential across the capacitors. Thus, the voltage passing through the capacitor CCA is ($V_{now}$–$V_{old}$+VT–Vth), while the voltage passing through the capacitor CCB is ($V_{now}$–$V_{old}$+VT–Vth).

As a result of the voltage relationships defined above, whenever ($V_{now}$–$V_{old}$)>Vth, the output of the inverter INV1 is low. In contrast, whenever ($V_{now}$–$V_{old}$)<Vth, the output of the inverter INV1 is high. Similarly, whenever ($V_{now}$–$V_{old}$)>–Vth, the output of the inverter INV2 is low, and whenever ($V_{now}$–$V_{old}$)<–Vth, the output of the inverter INV2 is high. These logic outputs are passed through the inverters INV3, INV4, INV5 and input into a NAND gate NA, as shown in FIG. 8. As a result, whenever ($V_{now}$–$V_{old}$) from the NAND gate NA is in the range of –Vth to Vth, the NAND gate NA produces a low output. Whenever ($V_{now}$–$V_{old}$) is outside the range of –Vth to Vth, the NAND gate NA produces a high output.

In order to provide a more accurate output, a control pulse φSD is provided at predetermined timing intervals so as to close the MOS switches QB3, QB4. As a result, the capacitors CCA, CCB are recharged in a positive return direction through the inverters INV3, INV4, thereby providing a more stable output signal.

As with the difference-detection circuit 41 b, the difference-detection circuit 51b determines when the absolute value of the difference between pixel outputs from subsequent frames exceeds a predetermined threshold, providing a single-bit digitized logical output signal.

While the present invention has been described in connection with preferred embodiments, it will be understood that the invention is not limited to those embodiments. On the contrary, the invention is intended to cover all alternatives, modifications, and equivalents as may be included within the spirit and scope of the invention as defined in the appended claims.

What is claimed is:

1. A solid-state image-pickup device, comprising:
    (a) multiple pixels arranged in an array of at least one column and at least one row, each pixel producing an electrical charge according to a light quantity received by the pixel and producing a corresponding pixel-output signal;
    (b) a respective individual vertical-readout line for each column of pixels, each pixel in the respective column having an output connected to the respective vertical-readout line, each vertical-readout line having an output terminus;
    (c) a first vertical-scanning circuit that controllably switches the outputs of the pixels in each column to the respective vertical-readout line according to a predetermined readout sequence;
    (d) a set of differential-processing circuits, a respective differential-processing circuit being connected to the output terminus of each respective vertical-readout line, each differential-processing circuit receiving pixel-output signals and corresponding pixel dark signals carried by the respective vertical-readout line, and providing an output signal, from which the pixel dark signals have been removed, at an output terminus of the respective differential-processing circuit;
    (e) a first horizontal-readout line commonly connected to the output termini of the differential-processing circuits;
    (f) a set of body-motion-detection circuits, a respective body-motion-detection circuit being connected to the output terminus of the respective vertical-readout line, each body-motion-detection circuit receiving a pixel-output signal from a current frame and a pixel-output signal from a previous frame carried by the respective vertical-readout line and providing an output signal based on a difference between the respective pixel-output signal from the current frame and the respective pixel-output signal from the previous frame, at an output terminus of the respective body-motion-detection circuit;
    (g) a second horizontal-readout line commonly connected to the output termini of the body-motion-detection circuits;
    (h) a horizontal-transfer circuit configured and situated so as to controllably trigger release of output signals of the differential-processing circuits and the body-motion-detection circuits so that such output signals are sequentially read out on the respective first and second horizontal-readout lines; and
    (i) each pixel comprising an electronic shutter serving to selectively discharge residual charges stored in the respective pixel so as to reset the pixel in preparation for outputting a subsequently produced pixel-output signal.

2. The solid-state image-pickup device of claim 1, wherein the differential-processing circuits comprise a capacitor and multiple semiconductor switches.

3. The solid-state image-pickup device of claim 1, wherein each body-motion-detection circuit comprises a capacitor and multiple semiconductor switches.

4. The solid-state image-pickup device of claim 1, wherein output signals conducted by the first horizontal-readout line constitute an image signal, and output signals conducted by the second horizontal-readout line constitute a motion-detection signal.

5. The solid-state image-pickup device of claim 4, wherein the image signal is synchronous with the motion-detection signal on a pixel-by-pixel basis.

6. The solid-state image-pickup device of claim 1, wherein each pixel comprises a control input, the control inputs for the multiple pixels being commonly connected by row to respective control-signal lines from the vertical-scanning circuit.

7. The solid-state image-pickup device of claim 1, wherein each pixel comprises a control input, the device further comprising a second vertical-scanning circuit, the control inputs for the multiple pixels being commonly connected by row to respective control-signal lines from the first and second vertical-scanning circuits, the first and second vertical-scanning circuits being situated on opposite sides of the pixel array and being operable in a synchronous manner with each other.

8. The solid-state image-pickup device of claim 1, further comprising a respective reset switch for each respective vertical-readout line, the reset switches being connected to a reference potential and discharging residual charges on the vertical-readout lines when the reset switches are closed.

9. The solid-state image-pickup device of claim 1, wherein each pixel comprises:

a photodiode having an anode and a cathode and producing an electrical charge according to a light quantity received on a respective light-receiving surface and producing a corresponding pixel-output signal, the cathode of the photodiode being connected to a positive voltage source;

a first semiconductor switch situated between the anode of the photodiode and a reference voltage source, the first semiconductor switch serving as the electronic shutter for the pixel;

a second semiconductor switch having first and second terminals, the first terminal being connected to the anode of the photodiode;

a junction-type field-effect transistor (JFET) having a gate, a source, and a drain, the gate being connected to the second terminal of the second semiconductor switch, and the drain being connected to the positive voltage source;

a third semiconductor switch having first and second terminals, the first terminal being connected to the gate of the JFET and the second terminal being connected to the reference voltage source; and a fourth semiconductor switch having first and second terminals, the first terminal being connected to the source of the JFET and the second terminal being connected to the respective vertical-readout line for the column of pixels.

10. The solid-state image-pickup device of claim 9, wherein the pixels are operable to simultaneously hold electrical output signals produced by the photodiode during a current frame and electrical output signals produced by the photodiode during a previous frame.

11. The solid-state image-pickup device of claim 1, wherein:

each pixel comprises a photodiode having an anode and a cathode and producing an electrical charge according to a light quantity received on a respective light-receiving surface and outputting a corresponding pixel-output signal, the cathode being connected to a positive voltage source; and the electronic shutter comprises a MOS switch situated between the anode and a conductor at a uniform reset potential, so that the anode can be selectively reset to the uniform reset potential.

12. A solid-state image-pickup device, comprising:

(a) multiple pixels arranged in an array of at least one column and at least one row, each pixel producing an electrical charge according to a light quantity received by the pixel and producing a corresponding pixel-output signal, each pixel comprising an electronic shutter serving to selectively discharge residual charges stored in the respective pixel so as to reset the pixel in preparation for outputting a subsequently produced pixel-output signal;

(b) a respective individual vertical-readout line for each column of pixels, each pixel in the respective column having an output connected to the respective vertical-readout line, each vertical-readout line having an output terminus;

(c) a vertical-scanning circuit that controllably switches the outputs of the pixels in each column to the respective vertical-readout line according to a predetermined readout sequence;

(d) a set of differential-processing circuits, wherein a respective differential-processing circuit is connected to the output terminus of a respective vertical-readout line, each differential-processing circuit receiving pixel-output signals and corresponding pixel dark signals carried by the respective vertical-readout line and providing an output signal, from which the pixel dark signals have been removed, at an output terminus of the respective differential-processing circuit;

(e) a horizontal-readout line commonly connected to the output termini of the differential-processing circuits;

(f) a first horizontal-transfer circuit configured and situated so as to controllably trigger release of the output signals of the differential-processing circuits so that such output signals are sequentially read out on the horizontal-readout line;

(g) a respective individual difference-detection circuit connected to the output terminus of each respective vertical-readout line, each difference-detection circuit receiving pixel-output signals from a current frame and pixel-output signals from a previous frame carried by the respective vertical-readout line and providing an output signal based on a difference between the respective pixel-output signal from the current frame and the respective pixel-output signal from the previous frame, at an output of the respective difference-detection circuit; and (h) a horizontal-transfer circuit connected to the termini of the difference-detection circuits, the horizontal-transfer circuit being configured and situated so as to controllably output the difference-detection-circuit outputs in a horizontal-line sequence to form a motion-detection signal.

13. The solid-state image-pickup device of claim 12, wherein the horizontal-transfer circuit comprises a shift register, the shift register having inputs connected to the termini of the difference-detection circuits, the shift register storing the signals output by the difference-detection circuits and controllably outputting the stored signals in a horizontal-line sequence to form the motion-detection signal.

14. The solid-state image-pickup device of claim 12, wherein each difference-detection circuit provides a binary output indicating whether an absolute value of the difference between the respective pixel-output signals for a current frame and a previous frame have exceeded a predetermined threshold value.

15. The sold-state image-pickup device of claim 12, further comprising an individual respective reset switch for each respective vertical-readout line, the reset switches being connected to a reference potential and discharging residual charges on the respective vertical-readout lines when the respective reset switches are closed.

16. The solid-state image-pickup device of claim 12, wherein each pixel comprises:
- a photodiode having an anode and a cathode and producing an electrical output signal according to a light quantity received on a respective light-receiving surface, the cathode of the photodiode being connected to a positive voltage source;
- a first semiconductor switch situated between the anode of the photodiode and a reference voltage source, the first semiconductor switch serving as the electronic shutter for the pixel;
- a second semiconductor switch having first and second terminals, the first terminal being connected to the anode of the photodiode;
- a junction-type field-effect transistor (JFET) having a gate, a source, and a drain, the gate being connected to the second terminal of the second semiconductor switch and the source being connected to the positive voltage source;
- a third semiconductor switch having first and second terminals, the first terminal being connected to the gate of the JFET and the second terminal being connected to the reference voltage source; and
- a fourth semiconductor switch having first and second terminals, the first terminal being connected to the drain of the JFET and the second terminal being connected to the respective vertical-readout line for the column of pixels.

17. The solid-state image-pickup device of claim 16, wherein the pixels are operable to simultaneously hold electrical output signals produced by the photodiode during a current frame and produced by the photodiode during a previous frame.

18. The solid-state image-pickup device of claim 12, wherein each difference-detection circuit comprises:
- a first sample-and-hold circuit connected to the respective vertical-readout line and storing the respective pixel-output signals from a current frame;
- a second sample-and-hold circuit connected to the respective vertical-readout line and storing the respective pixel-output signals from a previous frame; and
- a comparator circuit connected to and receiving inputs from the first and second sample-and-hold circuits and outputting a logic signal based on whether an absolute value of a difference between the respective pixel-output signals for the current frame and respective pixel-output signals for the previous frame exceeds a predetermined threshold value.

19. The solid-state image-pickup device of claim 18, wherein each comparator circuit comprises:

- a first comparator having plus and minus inputs, the plus input being connected to the first sample-and-hold circuit and the minus input being connected to the second sample-and-hold circuit, the first comparator outputting a high logic signal if an absolute value of a difference between the signals produced by the respective first and second sample-and-hold circuits exceeds a predetermined threshold value;
- a second comparator having plus and minus inputs, the plus input being connected to the second sample-and-hold circuit, and the minus input being connected to the first sample-and-hold circuit, the second comparator outputting a high logic signal if an absolute value of a difference between the signals produced by the respective first and second sample-and-hold circuits exceeds a predetermined threshold value; and
- an OR gate having inputs connected to the outputs of the respective first and second comparators, the OR gate outputting a high logic signal if either of the respective first or second comparators outputs a high logic signal.

20. A drive method for simultaneously reading out an image signal and a motion-detection signal from a solid-state image-pickup device that comprises multiple pixels arranged in a planar array of at least one column and at least one row, each pixel producing an electrical output signal according to a light quantity received by the pixel; a separate vertical read-out line for each column of pixels, each pixel in the respective column having an output connected to the respective vertical read-out line and each vertical read-out line having a terminus; a vertical-scanning circuit that controllably switches output signals produced by the pixels in the respective column to the respective vertical-readout line; a separate differential-processing circuit connected to an output terminus of the respective vertical-readout line and having an output terminus; a first horizontal-readout line commonly connected to the output termini of the differential-processing circuits; a separate body-motion-detection circuit connected to the output terminus of the respective vertical-readout line and having an output terminus; a second horizontal-readout line commonly connected to the output termini of the body-motion-detection circuits; and a horizontal-transfer circuit providing control signals to the differential-processing circuits and the body-motion-detection circuits, the drive method comprising the steps:

(a) performing an electronic shutter function by discharging residual charges from the pixels while leaving intact stored charges from a previous frame;
(b) vertically scanning the pixel-output signals for the previous frame for a selected row of pixels to the vertical-readout lines;
(c) storing a charge corresponding to the pixel-output signals in the respective body-motion-detection circuit;
(d) vertically scanning pixel dark signals for the current frame for the selected row of pixels to the respective vertical-readout lines;
(e) storing a charge corresponding to the pixel dark signals in the respective differential-processing circuit;
(f) vertically scanning the pixel-output signals for the current frame for the selected row of pixels to the respective vertical-readout lines;
(g) subtracting the stored charges of the current-frame dark signals from the current-frame output signals in the differential-processing circuits and horizontally scanning the resultant signal out on the first horizontal-readout line;
(h) subtracting the stored charges of the previous-frame output signals from the current-frame output signals in the respective body-motion-detection circuit and horizontally scanning the resulting signal out on the second horizontal-readout line; and (i) repeating steps (b)–(h) with the selected row being vertically shifted to simultaneous produce a frame's worth of an image signal and of a motion-detection signal.

21. The method of claim 20, further comprising the step, prior to step (a), of performing an electronic shutter function by discharging the output signals from the pixels at a predetermined time prior to reading the pixel outputs.

22. A drive method for simultaneously reading out an image signal and a motion-detection signal from a solid-state image-pickup device that comprises multiple pixels arranged in an array of at least one column and at least one row, each pixel producing an electrical output signal according to a light quantity received by the pixel; a separate vertical-readout line for each column of pixels, each pixel in the respective column having an output connected to the respective vertical-readout line and each vertical-readout line having a terminus; a vertical-scanning circuit that controllably switches output signals produced by the pixels in the respective column to the respective vertical-readout line; a separate differential-processing circuit connected to an output terminus of each respective vertical-readout line and having an output terminus; a horizontal-readout line commonly connected to the output termini of the differential-processing circuits; a separate difference-detection circuit connected to the output terminus of each respective vertical-readout line and having an output terminus; and a horizontal-transfer circuit commonly connected to the output termini of the difference-detection circuits and that provides control signals to the differential-processing circuits, the method comprising the steps:

(a) performing an electronic shutter function by discharging residual charges from the pixels while leaving intact stored charges corresponding to a previous frame;

(b) vertically scanning the pixel-output signals for a previous frame for a selected row of pixels to the vertical-readout lines;

(c) storing a charge corresponding to the pixel-output signals in the respective difference-detection circuit;

(d) vertically scanning pixel dark signals for the current frame for the selected row of pixels to the respective vertical-readout lines;

(e) storing a charge corresponding to the pixel dark signals in a respective differential-processing circuit;

(f) vertically scanning the pixel-output signals for the current frame for the selected row of pixels to the respective vertical-readout lines;

(g) storing a charge corresponding to the pixel-output signals in the respective difference-detection circuit;

(h) subtracting the stored charges of the current-frame dark signals from the current-frame output signals in the differential-processing circuits and horizontally scanning the resulting signal out on the horizontal-readout line;

(i) comparing the stored charges of the previous-frame output signals with the stored charges of the current-frame output signals in the difference-detection circuits to determine whether an absolute value of a difference of the stored charges exceeds a predetermined threshold, and outputting a binary signal, based on the determination, to the horizontal-scanning circuit;

(j) sequentially outputting the binary signals with the horizontal-scanning circuit to produce a motion-detection signal; and (k) repeating steps (b)–(j) with the selected row being vertically shifted to simultaneously produce a frame's worth of an image signal and a motion-detection signal.

* * * * *

UNITED STATES PATENT AND TRADEMARK OFFICE
CERTIFICATE OF CORRECTION

PATENT NO. : 6,590,611 B1
DATED : July 8, 2003
INVENTOR(S) : Ishida et al.

It is certified that error appears in the above-identified patent and that said Letters Patent is hereby corrected as shown below:

Column 6,
Line 61, "(unction-type" should be -- (junction-type --.

Column 7,
Line 37, "φHI," should be -- φH1, --.

Column 8,
Line 41, "412." should be -- 12. --.

Column 9,
Line 18, "verticaltransfer" should be -- vertical-transfer --.
Line 47, "MOS switches 23a in the differential-processing circuit 21a." should be
-- During the period T4, the control pulse φN is switched to high, which closes the MOS switches 23a in the differential-processing circuit 21a --.

Column 12,
Line 29, "tie circuit" should be -- the circuit --.
Line 45, "φRSG1I," should be -- φRSG1, --.

Column 13,
Line 13, "φH2-KHm" should be -- φH2-φHm --.

Column 17,
Line 65, "41 b," should be -- 41b, --.

Column 22,
Line 3, "circuit and" should be -- circuit, and --.

Signed and Sealed this

Twenty-third Day of March, 2004

JON W. DUDAS
*Acting Director of the United States Patent and Trademark Office*